(12) United States Patent
Knierim et al.

(10) Patent No.: US 8,456,173 B2
(45) Date of Patent: Jun. 4, 2013

(54) SIGNAL ACQUISITION SYSTEM HAVING PROBE CABLE TERMINATION IN A SIGNAL PROCESSING INSTRUMENT

(75) Inventors: Daniel G. Knierim, Beaverton, OR (US); Josiah A. Bartlett, Forest Grove, OR (US); Ira G. Pollock, Hillsboro, OR (US); Lester L. Larson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 129 days.

(21) Appl. No.: 12/846,750

(22) Filed: Jul. 29, 2010

(65) Prior Publication Data

US 2011/0074389 A1 Mar. 31, 2011

Related U.S. Application Data

(63) Continuation-in-part of application No. 12/571,236, filed on Sep. 30, 2009, now abandoned.

(51) Int. Cl.
*G01R 35/00* (2006.01)

(52) U.S. Cl.
USPC ........... 324/601; 324/72.5; 324/754; 330/254

(58) Field of Classification Search
USPC .......................................................... 324/601
See application file for complete search history.

(56) References Cited

U.S. PATENT DOCUMENTS

| | | | | |
|---|---|---|---|---|
| 2,883,619 A * | 4/1959 | Kobbe et al. | ................... | 324/72.5 |
| 4,034,291 A * | 7/1977 | Allen et al. | ................ | 324/121 R |
| 4,260,951 A * | 4/1981 | Lewyn | ........................... | 600/502 |
| 4,397,549 A * | 8/1983 | Morgan | ........................ | 356/5.01 |
| 4,743,839 A * | 5/1988 | Rush | ............................. | 324/72.5 |
| 4,996,497 A * | 2/1991 | Waehner | ........................ | 330/151 |
| 5,172,051 A | 12/1992 | Zamborelli | | |
| 5,274,336 A * | 12/1993 | Crook et al. | ................... | 324/690 |
| 5,472,561 A * | 12/1995 | Williams et al. | ................ | 438/10 |
| 6,226,322 B1 * | 5/2001 | Mukherjee | ..................... | 375/229 |
| 6,307,363 B1 * | 10/2001 | Anderson | ..................... | 324/72.5 |
| 6,483,284 B1 * | 11/2002 | Eskeldson et al. | ............ | 324/72.5 |
| 6,710,959 B1 * | 3/2004 | Iroaga | .............................. | 360/67 |
| 6,856,126 B2 * | 2/2005 | McTigue et al. | .............. | 324/72.5 |
| 6,864,761 B2 | 3/2005 | Eskeldson et al. | | |
| 6,870,359 B1 * | 3/2005 | Sekel | ........................ | 324/750.02 |

(Continued)

OTHER PUBLICATIONS

Patrick A. McGovern, Nanosecond Passive Voltage Probes, IEEE Transaction on Instrumentation and Measurement, vol. IM-26, No. 1, Mar. 1977, pp. 46-52.

(Continued)

*Primary Examiner* — Melissa Koval
*Assistant Examiner* — Benjamin M Baldridge
(74) *Attorney, Agent, or Firm* — William K. Bucher

(57) ABSTRACT

A signal acquisition system has a signal acquisition probe having probe tip circuitry coupled to a resistive center conductor signal cable with the signal cable coupled to a signal processing instrument via an input node. The input node is coupled to an input current amplifier via input circuitry. The input circuitry provides at least one of resistive and capacitive termination of the resistive center conductor signal cable. The termination of the resistive center conductor signal cable in the signal processing instrument provides a signal acquisition system where the capacitive loading of a device under test at higher frequencies is reduced by reducing the input capacitance of the probe tip circuitry resulting in an increase in the signal acquisition system bandwidth.

10 Claims, 4 Drawing Sheets

U.S. PATENT DOCUMENTS

| | | | |
|---|---|---|---|
| 7,679,422 B1* | 3/2010 | Thiagarajan et al. | 327/337 |
| 2004/0008043 A1* | 1/2004 | Thomas et al. | 324/715 |
| 2004/0075510 A1* | 4/2004 | Eskeldson et al. | 333/32 |
| 2004/0249485 A1* | 12/2004 | Bondarev et al. | 700/71 |
| 2005/0134368 A1* | 6/2005 | Chandrasekaran | 330/9 |
| 2005/0253651 A1* | 11/2005 | Quek | 330/107 |
| 2007/0126501 A1* | 6/2007 | Kim et al. | 330/86 |
| 2007/0159196 A1* | 7/2007 | Hayden et al. | 324/754 |
| 2008/0048778 A1* | 2/2008 | Lee et al. | 330/253 |
| 2009/0134893 A1* | 5/2009 | Frame et al. | 324/754 |
| 2010/0007419 A1* | 1/2010 | Gilbert | 330/254 |
| 2010/0042338 A1* | 2/2010 | Giurgiutiu et al. | 702/39 |

OTHER PUBLICATIONS

U.S. Appl. No. 12/846,721, filed Jul. 29, 2010, titled "Signal Acquisition System Having Reduced Probe Loading of a Device Under Test".

U.S. Appl. No. 12/846,742, filed Jul. 29, 2010, titled "Signal Acquisition System Having a Compensation Digital Filter".

U.S. Appl. No. 12/846,745, filed Jul. 29, 2010, titled "Signal Acquisition System Having Reduced Probe Loading of a Device Under Test".

U.S. Appl. No. 12/571,236, filed Sep. 30, 2009, titled "Low Capacitance Signal Acqusition System".

Preliminary Amendment, filed Aug. 9, 2010, for U.S. Appl. No. 12/846,742, filed Jul. 29, 2010, titled "Signal Acquisition System Having a Compensation Digital Filter".

Preliminary Amendment, filed Aug. 9, 2010, for U.S. Appl. No. 12/846,721, filed Jul. 29, 2010, titled "Signal Acquisition System Having Reduced Probe Loading of a Device Under Test".

Preliminary Amendment, filed Aug. 9, 2010, for U.S. Appl. No. 12/846,745, filed Jul. 29, 2010, titled "Signal Acquisition System Having Reduced Probe Loading of a Device Under Test".

* cited by examiner

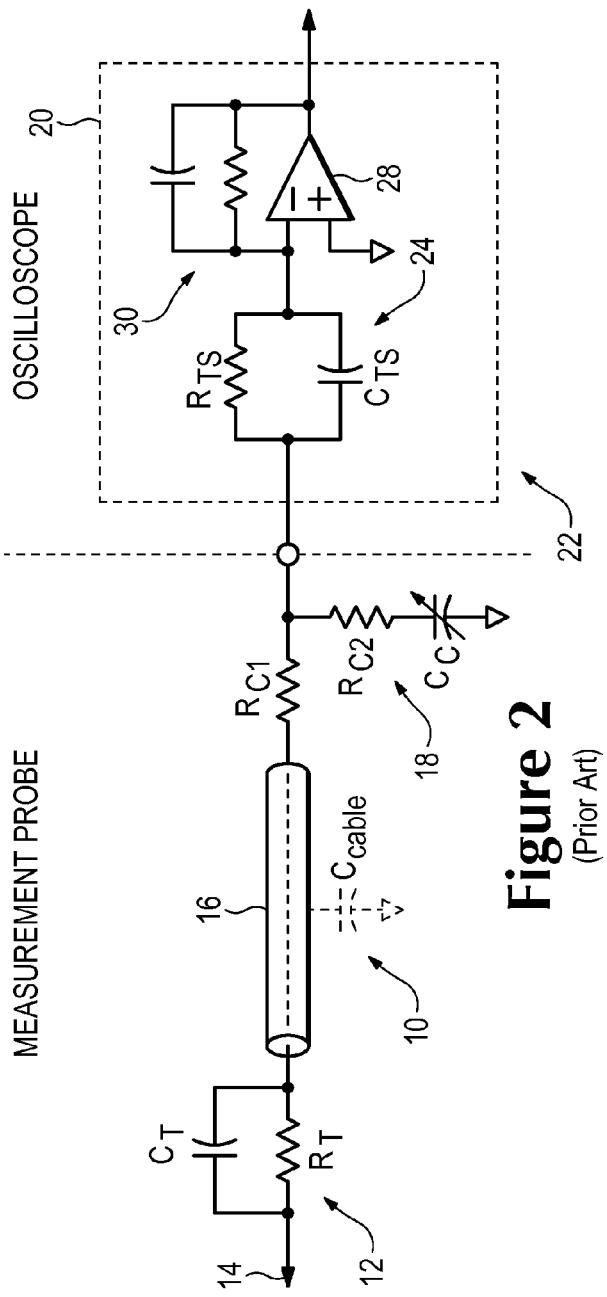
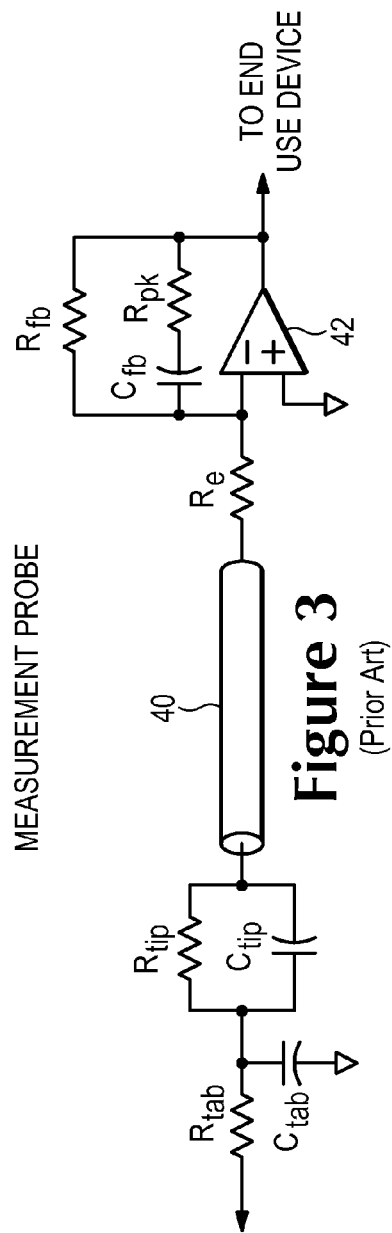
Figure 2 (Prior Art)
Figure 3 (Prior Art)

SIGNAL ACQUISITION SYSTEM HAVING PROBE CABLE TERMINATION IN A SIGNAL PROCESSING INSTRUMENT

CROSS REFERENCE TO RELATED APPLICATION

This Continuation-in-Part application claims priority from U.S. patent application Ser. No. 12/571,236, filed Sep. 30, 2009.

BACKGROUND OF THE INVENTION

The present invention relates generally to acquiring a signal from a device under test and more particularly to a signal acquisition system having a signal acquisition probe and signal processing instrument where the resistive center conductor cable of the signal acquisition probe is terminated in a signal processing instrument.

Traditional passive voltage probes 10 generally consist of a resistive-capacitive parallel network 12 at the probe tip 14, shown as $R_T$ and $C_T$ in FIG. 1, coupled via a resistive center conductor cable 16 to compensation circuitry 18 in a compensation box. The compensation circuitry 18 has resistive elements $R_{C1}$ and $R_{C2}$ and capacitive element $C_C$. $R_{C1}$ is in series with the cable 16 and $R_{C2}$ is in series with variable capacitor $C_C$. The compensation circuitry 18 is coupled to input circuitry 20 of a measurement test instrument 22, such as an oscilloscope, spectrum analyzer, logic analyzer and the like. Generally, the input circuitry 20 of an oscilloscope includes an input resistive-capacitive network 24, shown as $R_{TS}$ and $C_{TS}$, that is associated with switching input attenuation circuitry (not shown) that provides an input impedance for the oscilloscope of 1 MΩ in parallel with 10 to 20 picofarad (pf) of capacitance. The output of the switching input attenuation circuitry is coupled to the input of a preamplifier 26. The oscilloscope is calibrated to provide a nominally flat frequency response transfer function from the input of the oscilloscope to the output of the preamplifier.

The compensation circuitry 18 provides resistive and capacitive termination of the cable 16 to minimize reflections and provides a transfer function having a nominally flat frequency response to the measurement test instrument 22. The variable compensation capacitor $C_C$ is user adjustable to match the capacitive and resistive divider ratios of the probe over variations in the input capacitance of individual oscilloscope channels. Resistive element $R_{C1}$ provides resistive cable 16 termination matching into the oscilloscope input at high frequencies (where cable $Z_0 \approx 155\Omega$). $R_{C2}$ in series with variable capacitor $C_C$ improves the cable termination into the capacitive load in the oscilloscope.

The tip resistance $R_T$, cable termination resistor $R_{C1}$ and the input resistance $R_{TS}$ form a voltage divider attenuation network for DC to low frequency input signals. To accommodate a wide frequency range of input signals, the resistive voltage divider attenuation network is compensated using a shunt tip capacitor $C_T$ across the tip resistive element $R_T$ and a shunt termination capacitor $C_C$ and the input capacitor $C_{TS}$ across termination resistive element $R_{TS}$. To obtain a properly compensated voltage divider, the time constant of the probe tip resistive-capacitive parallel network 12 must equal the time constant of the termination resistive-capacitive parallel network 24 including $C_{cable}$ and $C_C$.

Properly terminating the resistive cable 16 in its characteristic impedance requires adding a relatively large shunt capacitance $C_C$ to the compensation network 18. This is in addition to the bulk cable capacitance $C_{CABLE}$. For example, the tip resistance $R_T$ and capacitance $C_T$ for a P2222 10× Passive Probe, manufactured and sold by Tektronix, Inc., Beaverton, Oreg., is selected to give a 10× divide into the oscilloscope's input impedance of 1MΩ. The minimum tip capacitance $C_T$, neglecting any other parasitic capacitance, is one ninth of the sum of the cable bulk capacitance $C_{CABLE}$, $C_C$ and $C_{TS}$. The tip capacitance of $C_T$ is on the order of 8 pF to 12 pf for the above stated parameters. The input capacitance (which is $C_T$ in series with the sum of $C_{CABLE}$, $C_C$ and $C_{TS}$) is driven by the circuit being monitored and therefore represents a measure of how much the probe loads the circuit.

FIG. 2 illustrates another passive voltage probe and oscilloscope configuration where the preamplifier 28 is configured as a current amplifier. This configuration has the same limitations as the probe and oscilloscope configuration of FIG. 1. The probe has compensation circuitry in the probe compensation box and the oscilloscope has the traditional 1 MΩ resistance in parallel with 10 to 20 pf of capacitance at the oscilloscope input. A major drawback to existing passive voltage probe and oscilloscope configurations is that a substantial portion of the mid-band and high-band frequency signal current at the output of the resistive center conductor signal cable is shunted to ground by the termination capacitor $C_C$. In addition, since the resistive center conductor cable is terminated prior to the oscilloscope input, the parasitic capacitance of the input circuitry of the oscilloscope acts as a non-terminated transmission line which shunts additional current to ground.

The probe tip capacitance and the resistive center conductor cable affect the overall bandwidth of a traditional passive probe. Further, the probe tip input presents low input impedance to a device under test at high frequencies due to the low capacitive reactance in parallel with the high input resistance. Reducing the probe tip capacitance to increase the capacitive reactance requires adjustment of the other component values of the voltage divider network to maintain a compensated network. Previously, this has been accomplished by increasing the resistance in the probe tip. However, this increases the divider ratio of the network with a resulting increase in the attenuation of signal applied to the probe. The decreased signal input to the oscilloscope may be compensated for by increasing the gain of the oscilloscope input circuits which results in an increase in the noise on the signal reducing the overall signal-to-noise ratio of the instrument.

A special type of passive probe exists that provides a relatively high impedance and attenuation into a 50 ohm input oscilloscope. The $Z_0$ probe has a relatively low input resistance, 5 kilo ohms or less, coupled to a 50 ohm lossless coaxial cable. The capacitance at the probe tip is generally less than 1 pf produced by the parasitic capacitance of the probe head. In a specific embodiment, the probe tip resistance is 450 ohm coupled via the 50 ohm lossless coaxial cable to the 50 ohm input of the oscilloscope, which produces a 10× passive voltage divider network. The voltage input to this probe is limited as compared to the traditional passive probe due to the size of the input resistor. Also, the low input resistance can cause excessive loading to DC signals.

U.S. Pat. No. 6,483,284, shown in FIG. 3, teaches a wideband probe using pole-zero cancellation. A parallel probe tip network of resistor $R_{tip}$ and capacitor $C_{tip}$ in series with resistor $R_{tab}$ and capacitor $C_{tab}$ detects a signal from a device under test and couples the signal to a compensation network via a near lossless coaxial cable 40. The capacitor $C_{tab}$ represents the capacitance in the tip circuit, such as a trace on a circuit board, a coaxial cable or the like. A cable termination resistor $R_e$ is connected in series between the cable 40 and an inverting input terminal of an operational amplifier 42. The noninverting input is coupled to a common ground. Connected between the input terminal and the output terminal of the operational amplifier 42 is a parallel combination of a resistor $R_{fb}$ and a capacitor $C_{fb}$ with resistor $R_{pk}$ in series with $C_{fb}$. The parallel tip resistor $R_{tip}$ and capacitor $C_{tip}$ create a zero and the combination of resistor $R_{tab}$ and capacitor $C_{tab}$ create a pole. A pole is created by resistor $R_{fb}$ and capacitor $C_{fb}$ in the compensation network and a zero is created by resistor $R_{pk}$ and capacitor $C_{fb}$. The zero and pole created in the probe tip network are cancelled by the pole and zero in the compensation network. The output of the compensation network is coupled to an end user device, such as an oscilloscope or the like. The teaching states that the time constants of the two RC networks must be equal so that the zeros and poles balance out and the probe has a constant gain. Further, the operational amplifier 42 is part of the wideband probe circuitry and not part of the end user device.

SUMMARY OF THE INVENTION

The present invention is a signal acquisition system having a signal acquisition probe coupled to a signal processing instrument. The signal acquisition probe has probe tip circuitry coupled to a resistive center conductor signal cable. The signal processing instrument has an input node coupled to the resistive center conductor signal cable. The input node is coupled to an input amplifier disposed in the signal processing instrument via termination circuitry. The termination circuitry provides at least one of resistive and capacitive termination of the resistive center conductor signal cable.

The probe tip circuitry has at least a first resistive element coupled in parallel with at least a first capacitive element with the first capacitive element having a capacitance in the range of 2 to 5 picofarads for a typical "10×" probe. The input amplifier is preferably configured as a current amplifier having feedback circuitry including at least a first resistive element coupled in parallel with at least a first capacitive element that are coupled between an input and output of the current amplifier. The termination circuitry is preferably implemented as attenuation circuitry. The signal processing instrument has a signal path with one end of the signal path coupled to the input node and the other end coupled to a resistive element disposed adjacent to the input of the current amplifier forming a terminated transmission line.

In a preferred embodiment, the probe tip circuitry has a first time constant matching a second time constant of the resistive center conductor cable and the termination circuitry coupled to the input node. The termination circuitry has a third time constant matching a fourth time constant of the feedback circuitry of the current amplifier.

The signal acquisition system may be implemented with a switching circuit disposed in the signal processing instrument for selectively coupling the input node to the termination circuitry and for selectively coupling the input node to an alternate input signal channel. The alternate input signal channel has resistive and capacitive elements coupled to an input amplifier with the resistive and capacitive elements providing the signal processing instrument with input impedance compatible with legacy signal acquisition probes. The capacitive element represents the parasitic capacitance of the alternate input signal channel.

In a further embodiment of the signal acquisition system, the feedback circuitry of the current amplifier includes at least a first register for setting at least one of a resistive value and a capacitive value of first resistive element and the first capacitive element.

The objects, advantages and novel features of the present invention are apparent from the following detailed description when read in conjunction with appended claims and attached drawings.

BRIEF DESCRIPTION OF THE DRAWING FIGURES

FIG. 2 is representative schematic diagram of another prior art probe circuit.

FIG. 3 is representative schematic diagram of further prior art probe circuit.

DESCRIPTION OF THE INVENTION

Figure 1:
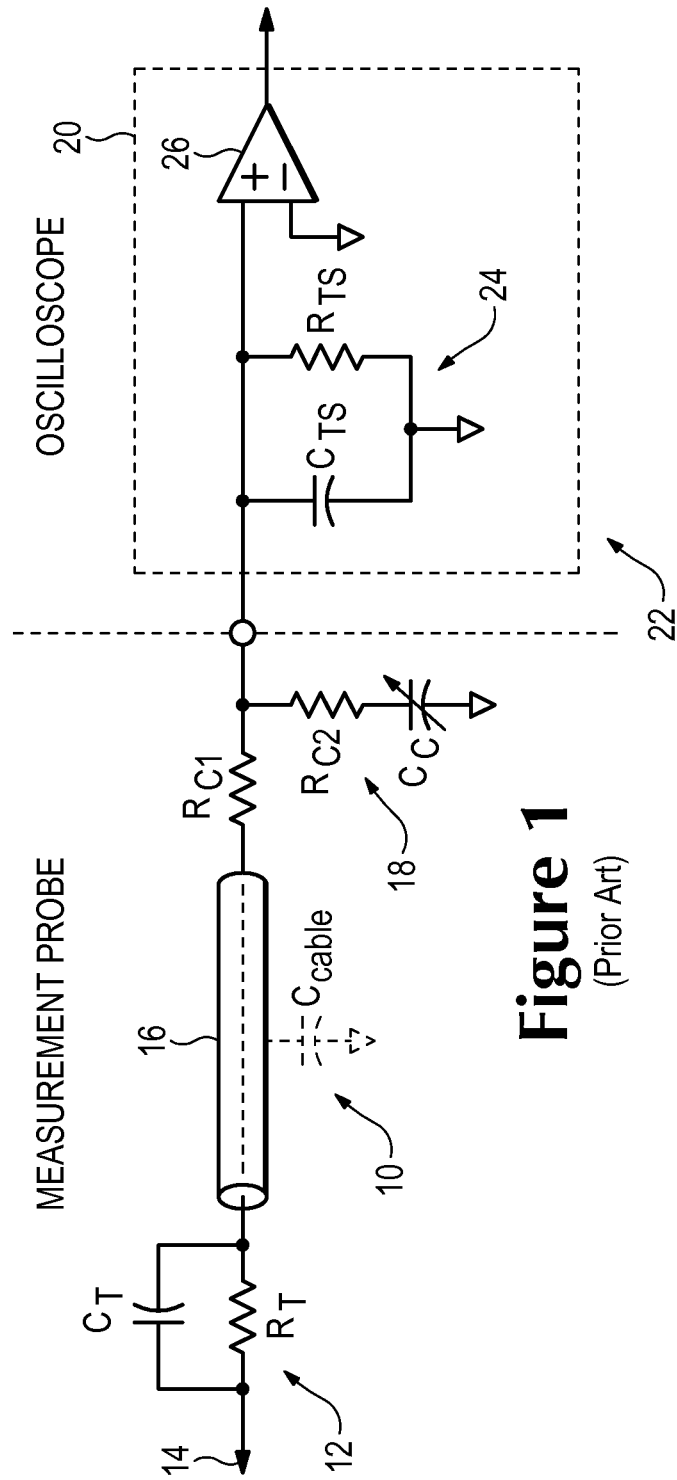
FIG. 1 is a representative schematic diagram of a prior art passive probe.
Figure 4:
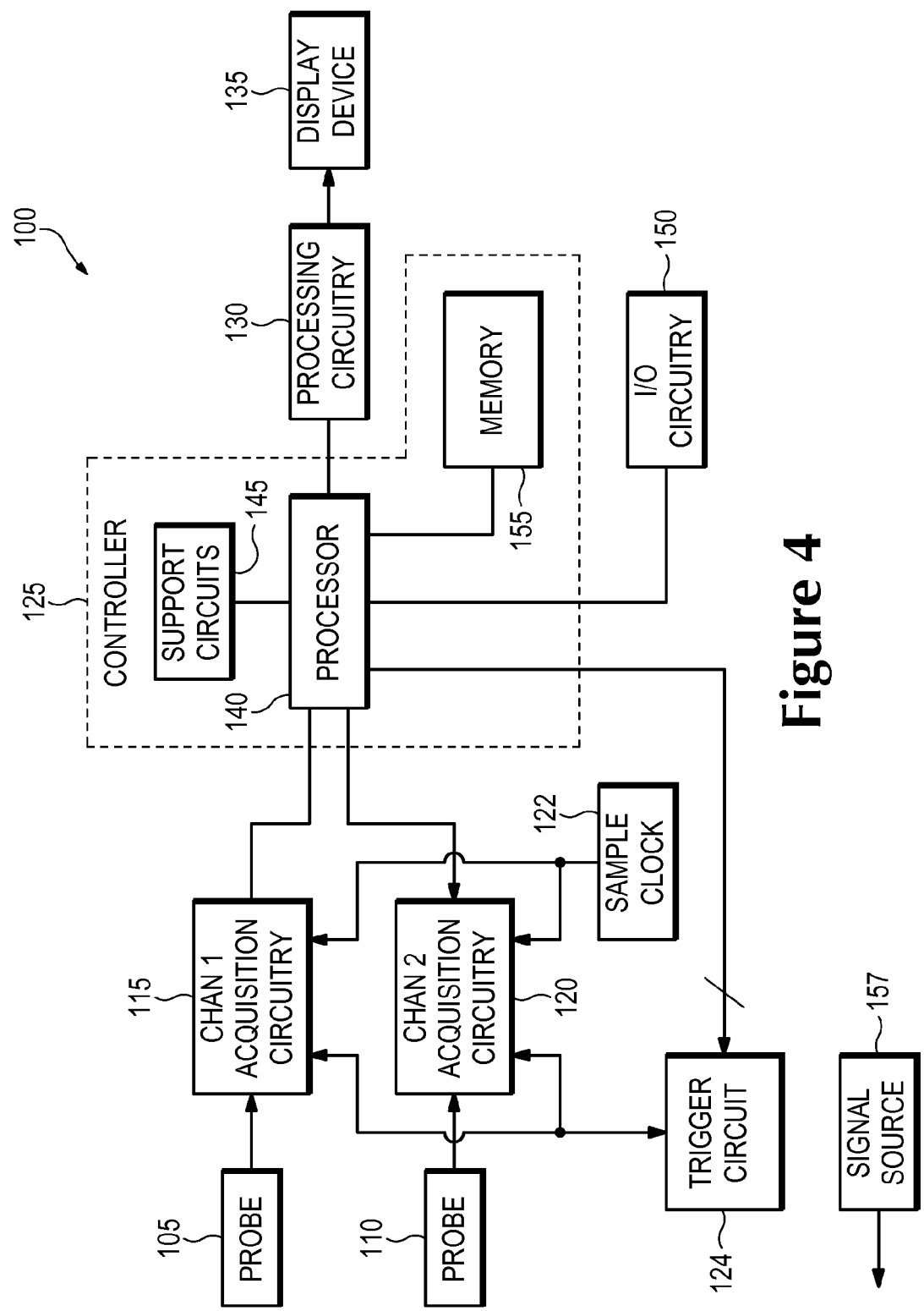
FIG. 4 is a representative block diagram of a signal processing instrument in a signal acquisition system having probe cable termination in a signal processing instrument according to the present invention.

The signal acquisition system of the present invention includes a passive voltage probe having probe tip circuitry in a probe head coupled to one end of a resistive center conductor signal cable. The other end of the resistive center conductor signal cable has an electrical connector that allow the passive voltage probe to be attached to a signal processing instrument, such as an oscilloscope, logic analyzer, digitizer and the like. The present invention will be described below with respect to a digital oscilloscope as shown in FIG. 4. The high level block diagram of FIG. 4 depicts a digital oscilloscope 100 used as part of the signal acquisition system of the subject invention. Generally, oscilloscopes 100 include multiple signal channels with each signal channel having an input on which are connected various types of signal acquisition probes 105, 110, such as passive and active voltage probes, current probes, and the like, for acquiring electrical signals from a device under test (DUT). The oscilloscope 100 signal channel inputs are coupled to respective signal channel acquisition circuitry 115, 120. The respective acquisition circuitry 115, 120 sample their respective input signals received from their signal acquisition probes 105, 110 in accordance with a sample clock provided by an internal sample clock generator 122.

The acquisition circuitry 115, 120 each include a preamplifier, analog-to-digital conversion circuitry, triggering circuitry, decimator circuitry, supporting acquisition memory, and the like. The acquisition circuitry 115, 120 operate to digitize, at a sample rate, one or more of the signals under test to produce one or more respective sample streams suitable for use by controller 125 or processing circuitry 130. The acquisition circuitry 115, 120, in response to commands received from the controller 125, changes preamplifier feedback values; trigger conditions, decimator functions, and other acquisition related parameters. The acquisition circuitry 115, 120 communicates its respective resulting sample stream to the controller 125.

A trigger circuit 124 is shown separate from the acquisition circuitry 115, 120 but one skilled in the art will realize that it could be internal to the acquisition circuitry. The trigger circuit 124 receives trigger parameters, such as trigger threshold level, hold off, post trigger acquisition, and the like, from the controller 125 in response to user input. The trigger circuit 124 conditions the acquisition circuitry 115, 120 for capturing digital samples of the signal under test from the DUT.

The controller 125 operates to process the one or more acquired sample streams provided by the acquisition circuitry 115, 120 to generate respective sample stream data associated with one or more sample streams. That is, given desired time per division and volts per division display parameters, controller 125 operates to modify or rasterize the raw data associated with an acquired sample stream to produce corresponding waveform data having the desired time per division and volts per division parameters. The controller 125 may also normalize waveform data having non-desired time per division, volts per division, and current per division parameters to produce waveform data having the desired parameters. The controller 125 provides the waveform data to processing circuitry 130 for subsequent presentation on display device 135.

The controller 125 of FIG. 4 preferably comprises a processor 140, such as a PowerPC™ Processor, manufactured and sold by Motorola, Inc., Schaumburg, Ill., support circuits 145 and memory 155. Processor 140 cooperates with conventional support circuitry 145, such as power supplies, clock circuits, cache memory, buffer/expanders, and the like, as well as circuits that assist in executing software routines stored in memory 155. As such, it is contemplated that some of the process steps discussed herein as software processes may be implemented within hardware, for example, as circuitry that cooperates with processor 140 to perform various steps. Controller 125 also interfaces with input/output (I/O) circuitry 150. For example, I/O circuitry 150 may comprise a keypad, pointing device, touch screen, or other means adapted to provide user input and output to the controller 125. The controller 125, in response to such user input, adapts the operations of acquisition circuitry 115, 120 to perform various data acquisitions, triggering, processing, and display communications, among other functions. In addition, the user input may be used to trigger automatic calibration functions or adapt other operating parameters of display device 135, logical analysis, or other data acquisition devices.

Memory 155 may include volatile memory, such as SRAM, DRAM, among other volatile memories. Memory 155 may also include non-volatile memory devices, such as a disk drive or a tape medium, among others, or programmable memory, such as an EPROM, among others. A signal source 157 generates a broad frequency content signal for probe compensation. In the preferred embodiment of the present invention, the broad frequency content signal is a fast edge square wave. Alternately, the signal source 157 may be a leveled variable frequency sine-wave generator.

Although Controller 125 of FIG. 4 is depicted as a general purpose computer that is programmed to perform various control functions in accordance with the present invention, the invention may be implemented in hardware such as, for example, an application specific integrated circuit (ASIC). As such, it is intended that processor 125, as described herein, be broadly interpreted as being equivalently performed by hardware, software, or by a combination thereof.

Figure 5:
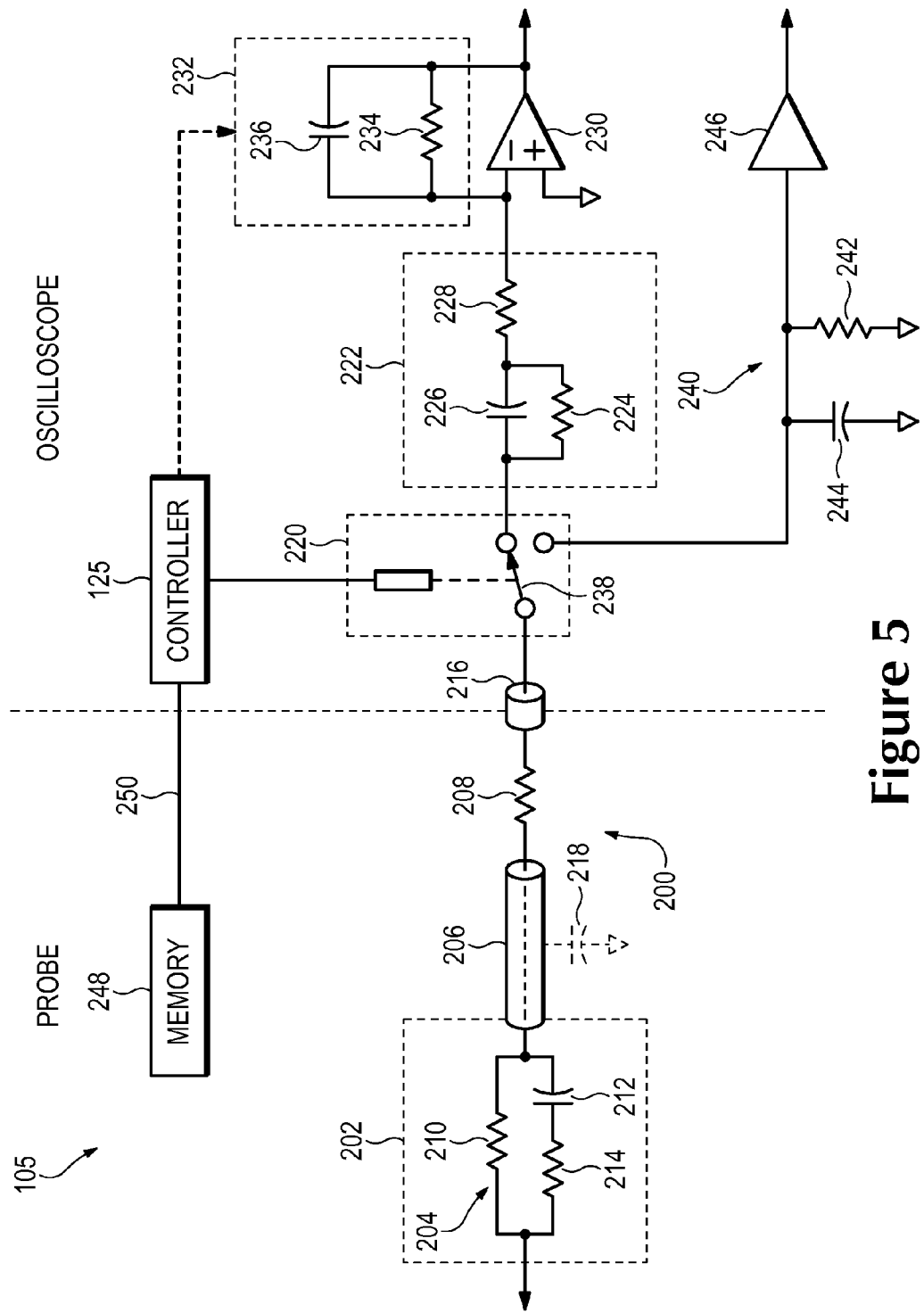
FIG. 5 is a representative schematic diagram of a signal acquisition system having probe cable termination in a signal processing instrument according to the present invention.

FIG. 5 is a representative schematic diagram of a signal acquisition system 200 according to the present invention. Like elements from FIG. 4 are labeled the same. The signal acquisition probe 105 has a probing head 202 containing low capacitance probe tip circuitry 204, a resistive center conductor signal cable 206, and a resistor element 208. The probe tip circuitry 204 has a resistive element 210 in parallel with a capacitive element 212 that is in series with a resistive element 214. The capacitive element 212 has a capacitance in the range of 2-5 picofarads (pf) to provide a low input capacitance to a device under test. The probe tip circuitry 204 is coupled to one end of the resistive center conductor signal cable 206. The other end of the resistive center conductor signal cable 206 is coupled to a BNC input node 216 of one of the signal acquisition circuitry 115, 120 in the digital oscilloscope 100 via the resistive element 208. The resistive center conductor signal cable 206 is preferably a coaxial cable having a resistive center conductor with a resistance of 39 Ω/ft. The resistive center conductor signal cable 206 has a capacitance to ground, which is shown by capacitor 218. The BNC input node 216 is coupled to a switching circuit 220 which in turn provides coupling of the signal acquisition probe 105 to input circuitry 222. The resistive element 208 in combination with resistive element 228 in the input circuitry 222, representatively shown as attenuation circuitry consisting of resistive element 224 in parallel with capacitive element 226, terminate the resistive center conductor signal cable 206 in its characteristic resistive impedance. In the preferred embodiment, the characteristic resistive impedance of the resistive center conductor signal cable 206 is approximately 150Ω with resistive element 208 having a resistive value of 100Ω and resistive element 228 having a resistive value of 50Ω. The resistive element 228 is physically located as close as possible to the input of the current amplifier 230 to reduce the non-terminated parasitic capacitance of the signal trace between the BNC input node 216 and the current amplifier 230. The BNC and signal trace here are assumed to be designed to a characteristic impedance of 50Ω so as to be properly terminated by resistive element 228. The input circuitry 222 also terminates the resistive center conductor signal cable 206 in its characteristic capacitive impedance. The input circuitry 222 is coupled to an input current amplifier 230 having feedback circuitry 232 consisting of resistive element 234 and capacitive element 236. The switching circuit 220 has a switching element 238 provided in the signal path between the BNC input node 216 and the input circuitry 222 for selectively coupling the probe tip circuitry 204 to the input current amplifier 230 via input circuitry 222 or coupling a separate input signal channel 240 having a resistive element 242 and capacitive element 244 coupled to a separate input amplifier 246. The resistive and capacitive element 242 and 244 provide a traditional oscilloscope input impedance of 1MΩ and capacitance of 12 to 20 pf to allow legacy passive probes to be used with the signal acquisition system 200 having the probe cable termination in a signal processing instrument 100.

The signal acquisition probe 105 preferably has a memory 248 containing information about the probe, such as probe type, serial number, and the like. The probe memory 248 is preferably a one wire EEPROM, manufactured and sold by Maxim Integrated Products, Inc., Sunnyvale, Calif. under Part No. DS2431. The probe memory 248 is coupled to the controller 125 via a one line communications/power line 250. Alternately, the probe memory 248 may communicate with the controller 125 via multi line communications bus, such as an I²C bus, a Firewire bus or the like.

In order to have a flat frequency response from the input to the probe tip circuitry 204 to the output of the input current amplifier 230, the time constant of the probe tip circuitry 204 should match the time constant at the BNC input node 216 and the time constant of the input circuitry 222 should match the time constant of the feedback elements of the input current amplifier 230 as represented by the below equations:

$$(R_{210} \cdot C_{212})_{TIP} = (R_{224} \cdot (C_{226} + C_{218}))_{IN} \qquad \text{EQ1}$$

$$(R_{224} \cdot C_{226})_{IC} = (R_{234} \cdot C_{236})_{AF} \qquad \text{EQ2}$$

where $(R_{210} \cdot C_{212})_{TIP}$ is the time constant of probe tip circuitry 204;

$(R_{224} \cdot (C_{226}+C_{218}))_{IN}$ is the time constant at the BNC input node 216;

$(R_{224} \cdot C_{226})_{IC}$ is the time constant of the input circuitry 222; and $(R_{234} \cdot C_{236})_{AF}$ is the time constant of the feedback circuitry 232 of the input current amplifier 230.

Moving the resistive and capacitive terminations of the resistive center conductor signal cable 206 into the signal processing instrument 100 substantially reduces the amount of mid-band and high-band frequency signal current being shunted to ground at the output of the resistive center conductor signal cable 206. In the prior art resistive center conductor signal cable passive voltage probes, a substantial portion, on the order of two-thirds of the mid-band and high-band signal current at the output of the probe cable, is shunted to ground by the termination capacitor in the probe compensation box depending on the termination capacitance of the cable and the parasitic capacitance of the oscilloscope input. Also, the resistive center conductor cable of the prior art is terminated in the compensation box of the probe which results in the parasitic capacitance in the input of the oscilloscope acting as a non-terminated stub, further shunting additional current to ground. In the present invention, the resistive and capacitive terminations in the input circuitry 222 are in series with the resistive center conductor signal cable 206 and the input of the current amplifier 230, resulting in substantially greater current flow into the input of the amplifier. The probe tip capacitance can be reduced to values in the range of 2-5 pf which reduces the mid-band and high-band frequency signal current at the output of the resistive center conductor signal cable 206. This decrease in signal current is offset by an overall increase in signal current provided to the input current amplifier resulting in a signal-to noise ratio equivalent to existing passive voltage probes. Additionally, the parasitic inductance and capacitance of the signal path from the BNC input node 216 to input current amplifier 230 along with the resistive element 228 essentially transforms the signal path into a terminated transmission line which further diminishes the amount of signal current shunted to ground. The result of moving the resistive and capacitive cable termination into the oscilloscope 200 and terminating the signal path in the instrument is that greater than fifty percent of the mid-band and high-band frequency signal current at the output of the resistive center conductor signal cable 206 is coupled to the input current amplifier 230 and an increase in the bandwidth of the signal acquisition system due to the elimination of the non-terminated stub between the BNC input node 216 and the input current amplifier 230.

The termination resistance and capacitance of the resistive center conductor signal cable 206 are fixed values for a given cable type where as the capacitance to ground of the resistive center conductor signal cable 206 varies with the length of the cable. In the preferred embodiment of the invention, the termination capacitance of the resistive center conductor signal cable 206 is approximately 40 pf and the termination resistance is approximately 150Ω. In addition, a 1.2 meter resistive center conductor signal cable 206 has, by coincidence, a capacitance to ground of approximately 40 pf. The capacitance to ground of the resistive center conductor signal cable 206 can be easily changed by changing the length of the cable. The resistive element 210 in the probe tip circuitry 204 has a value of 9.75 MΩ and the capacitive element 212 has a value of 3.4 pf. The capacitive value is lower than existing resistive center conductor passive voltage probes which generally have a capacitance in the range of 8 to 14 pf. Reducing the input capacitance at the probe tip reduces the capacitive loading of the device under test resulting in a wider probe bandwidth. The time constant for the probe tip circuitry using the above values is 33.15 μsec. The time constant across the BNC input node 216 should match the time constant of the probe tip circuitry 204. Limitations are placed on the capacitive element 226 in the input circuitry in that its capacitance should match the termination capacitance of the resistive center conductor signal cable 206. Therefore, the capacitance of capacitive element 226 is 40 pf. The capacitance to ground of the resistive center conductor signal cable 206, which is 40 pf, needs to added to the termination capacitance. The resulting capacitance at the BNC input node 216 is 80 pf. The probe tip circuitry 204 time constant is divided by the 80 pf value of the summed capacitive value of the termination capacitance and the capacitance to ground of the resistive center conductor signal cable 206 resulting in a value of 414.4 kΩ for the resistive element 224 of the input circuit. The attenuation factor for the resistive divider of resistive elements 210 and 224 is approximately 24.5× or a gain of approximately 0.0408.

The input circuitry 222 has a time constant of 16.575 μsec based on the resistive element 224 having a value of 414.4 kΩ and the capacitive element 226 having a value of 40 pf. The overall attenuation factor at the output of the input current amplifier 230 is 10×. Therefore, the gain of the input current amplifier should be 2.45. The value of the resistive element 234 in the feedback circuitry 232 is set at 1.015 MΩ. The input circuitry 222 time constant is divided by the 1,015 MΩ value of the resistive element 234 which results in the capacitive element 236 in the feedback circuitry 232 having a value of 16.33 pf.

The values in the above description are by example only and other values may be used. For example, the resistive element in the probe tip circuitry of a traditional 1× voltage probe has resistive value of 1 MΩ and the capacitive element has a capacitive value in the order of 100 pf to match the time constant across the BNC input of the oscilloscope. The present invention allows the input capacitance of the probe tip circuitry to be substantially reduced, on the order of 50%, without increasing the signal-to-noise ratio at the output of the input current amplifier 230. In addition, a different type of resistive center conductor signal cable 206 may be used having different characteristic resistive and capacitive impedances as well as a different capacitance to ground per unit length value which would require the resistive and capacitive elements 224 and 226 in the input circuitry 222 to have different values to match the time constant of the probe tip circuitry. Likewise, the values of the resistive and capacitive elements 234 and 236 would need to be changed to match the time constant of the input circuitry, The values of the elements in the above description need to take into account the parasitic capacitances that are present in the probe tip circuitry 204, the input circuitry 222 and the circuitry from the BNC input node 216 to the input circuitry 222. Additional resistive elements may be added to the circuits to compensate for parasitic capacitances. Further, the resistive center conductor signal cable 206 has dielectric and skin effect losses which may be compensated for by adding resistive and capacitive elements in parallel with the resistive element 208. Also, resistive and capacitive components coupled to ground may be added at the output of the resistive center conductor signal cable 206 to change a 10× probe into a high voltage probe. The addition of the resistive and capacitive elements to ground is to reduce the high voltage signal at the probe tip circuitry 204 so as to provide a safe voltage level at the output of the signal acquisition probe 105.

In a further embodiment of the present invention, the resistive element 234 and/or the capacitive element 236 in the feedback circuitry 232 of the input current amplifier 230 may be made electronically adjustable to compensate for component value and parasitic capacitance variations. The controller 125 communicates with the feedback circuitry 232 via signal bus, such as a four line Serial Peripheral Interface bus, for loading register values for the adjustable resistive and capacitive elements 234 and 236. The transfer function from the input of the probe tip circuitry 204 to the output of the input current amplifier 230 may be represented by a combination of poles and zeroes. The probe tip circuitry 204 and the input circuitry 222 create first and second zeros and the combination of the resistive center conductor cable 206 capacitance to ground 218 and the input circuit 222 creates a first pole and the feedback circuitry 232 creates a second pole. A user may be instructed to connect the signal acquisition probe 105 to the signal source 157 and initiate a calibration routine that adjusts the capacitive element 236 and/or the resistive element 234 so that the product of the two poles equals the product of the two zeros resulting in the matching of lowband gain and midband gain.

The input impedance of the oscilloscope 200 using the above values is 414.4 KΩ in parallel with 40 pf. This is in contrast to many existing oscilloscopes having an input impedance of 1MΩ in parallel with 10 to 20 pf. The result is that legacy passive voltage probes will not function properly with oscilloscopes using the present invention. A second input signal channel 240 may be added to the present invention to allow backward compatibility for legacy passive voltage probes. The switching element 238 in the switching circuit 220 is set to couple the BNC input node 216 to the second input signal channel 240 when no probe or a legacy probe is coupled to the BNC input node 216. This allows legacy probes to be coupled to the second input signal circuitry 240. When probes incorporating the present invention are connected to the oscilloscope 200, the controller 125 receives probe information over the communications/power line 250. The controller 125 provides commands to the switching circuit 220 to cause the switching element 238 to couple the probe to the input circuitry 222 that terminates the resistive center conductor signal cable 206.

A signal acquisition system has been described where the resistive and capacitive termination of resistive center conductor signal cable of a signal acquisition probe is placed within a signal processing instrument instead of the traditional resistive and capacitive termination in probe circuitry prior to the signal processing instrument. The signal acquisition system of the present invention provides a greater amount of the signal current at the output of the signal cable to the input amplifier in the signal processing instrument at midband and high-band frequencies. Terminating the resistive center conductor cable in the signal processing instrument makes the signal path from the signal processing instrument input to the input amplifier into a terminated transmission line further increasing the amount of signal current to the input amplifier.

In the preferred embodiment of the present invention, the probe tip capacitance is substantially reduced over existing resistive center conductor passive probes. However, the present invention may also be implemented using existing resistive center conductor passive probe tip capacitances that are generally in the range from 8-15 pf. Such probe configurations still have the advantages of reducing costs by eliminating the termination circuitry in the probe and increasing the amount of mid-band and high-band signal current at the output of the resistive center conductor cable being provided to the current amplifier which results in a higher signal-to noise ratio at the output of the input current amplifier. Therefore, it will be obvious to those having skill in the art that many changes may be made to the details of the above-described embodiments of this invention without departing from the underlying principles thereof. The scope of the present invention should, therefore, be determined only by the following claims.

What is claimed is:

1. A signal acquisition system comprising:
 a signal acquisition probe having probe tip circuitry coupled to a resistive center conductor coaxial signal cable having a characteristic impedance; and
 a signal processing instrument having an input node directly coupled to the resistive center conductor coaxial signal cable of the signal acquisition probe and directly coupled to an input amplifier disposed in the signal processing instrument via input circuitry disposed in the signal processing instrument between the input node and the input amplifier;
 wherein the input circuitry comprises only passive circuit elements or combinations of passive circuit elements in series, with no passive circuit elements or combination of passive circuit elements connecting the input circuitry to ground;
 wherein the resistive center conductor coaxial signal cable and the input circuitry are directly coupled in series with an input node of the input amplifier and the input circuitry substantially terminating both a resistive part and a capacitive part of the characteristic impedance of the resistive center conductor coaxial signal cable across the input node of the signal processing instrument thereby increasing mid-band and high-band frequency signal current from the output of the resistive center conductor coaxial signal cable into the input node of the input amplifier.

2. The signal acquisition system as recited in claim 1 wherein the probe tip circuitry further comprises at least a first resistive element coupled in parallel with at least a first capacitive element.

3. The signal acquisition system as recited in claim 2 wherein the first capacitive element has a capacitance in the range of 2 to 5 picofarads.

4. The signal acquisition system as recited in claim 1 wherein the input amplifier comprises a current amplifier.

5. The signal acquisition system as recited in claim 4 wherein the current amplifier further comprises feedback circuitry having at least a first resistive element coupled in parallel with at least a first capacitive element that are coupled between an input and output of the current amplifier.

6. The signal acquisition system as recited in claim 1 wherein the input circuitry further comprises attenuation circuitry.

7. The signal acquisition system as recited in claim 5 wherein the feedback circuitry of the current amplifier further comprises at least a first register for setting at least one of a resistive value and a capacitive value of first resistive element and the first capacitive element.

8. The signal acquisition system as recited in claim 1 further comprising a switching circuit disposed in the signal processing instrument for selectively coupling the input node of the signal processing instrument to the input circuitry and for selectively coupling the input node of the signal processing instrument to an alternate input signal channel.

9. The signal acquisition system as recited in claim 8 wherein the alternate input signal channel comprises resistive and capacitive elements coupled to an input amplifier with the resistive and capacitive elements providing the signal processing instrument with an input impedance compatible with legacy signal acquisition probes.

10. The signal acquisition system as recited in claim 5 wherein the signal processing instrument further comprises a signal path with one end of the signal path coupled to the input node of the signal processing instrument and the other end coupled to a resistive element disposed adjacent to the input node of the current amplifier forming a terminated transmission line.

\* \* \* \* \*